(12) United States Patent
Singh et al.

(10) Patent No.: US 7,208,390 B2
(45) Date of Patent: Apr. 24, 2007

(54) SEMICONDUCTOR DEVICE STRUCTURE AND METHOD FOR FORMING

(75) Inventors: Rana P. Singh, Austin, TX (US); Paul A. Ingersoll, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 829 days.

(21) Appl. No.: 10/045,913

(22) Filed: Jan. 9, 2002

(65) Prior Publication Data

US 2003/0098492 A1 May 29, 2003

Related U.S. Application Data

(63) Continuation-in-part of application No. 09/997,145, filed on Nov. 29, 2001.

(51) Int. Cl.
*H01L 21/76* (2006.01)
*H01L 21/8242* (2006.01)

(52) U.S. Cl. .................... 438/424; 438/427; 438/425; 438/426; 438/242; 438/243; 438/244

(58) Field of Classification Search ............. 438/427, 438/424, 425, 426, 242, 243, 244; 257/510, 257/394
See application file for complete search history.

(56) References Cited

U.S. PATENT DOCUMENTS

| | | | |
|---|---|---|---|
| 5,395,780 A | 3/1995 | Hwang | |
| 5,578,518 A * | 11/1996 | Koike et al. | 438/425 |
| 5,605,848 A | 2/1997 | Ngaoaram | |
| 5,646,063 A * | 7/1997 | Mehta et al. | 438/401 |
| 5,683,946 A | 11/1997 | Lu et al. | |
| 5,712,208 A | 1/1998 | Tseng et al. | |
| 5,726,087 A | 3/1998 | Tseng et al. | |
| 5,851,900 A * | 12/1998 | Chu et al. | 438/434 |
| 5,893,744 A * | 4/1999 | Wang | 438/427 |
| 5,960,276 A * | 9/1999 | Liaw et al. | 438/224 |
| 5,994,201 A * | 11/1999 | Lee | 438/427 |

(Continued)

OTHER PUBLICATIONS

S. Wolf (Silicon Processing for The VLSI Era, vol. 1, pp. 532-533.*

(Continued)

*Primary Examiner*—Sara Crane
*Assistant Examiner*—Samuel A. Gebremariam
(74) *Attorney, Agent, or Firm*—Joanna G. Chiu; James L. Clingan, Jr.

(57) ABSTRACT

A semiconductor device structure has trenches of two widths or more. The smallest widths are to maximize density. The greater widths may be required because of more demanding isolation, for example, in the case of non-volatile memories. These more demanding, wider isolation trenches are lined with a high quality grown oxide as part of the process for achieving the desired result of high quality isolation. For the case of the narrowest trenches, the additional liner causes the aspect ratio, the ratio of the depth of the trench to the width of the trench, to increase. Subsequent deposition of insulating material to fill the trenches with the highest aspect ratios can result in voids that can ultimately result in degraded yields. These voids are avoided by etching at least a portion of the liners of those trenches with the highest aspect ratios to reduce the aspect ratio to acceptable levels.

35 Claims, 4 Drawing Sheets

U.S. PATENT DOCUMENTS

| | | | |
|---|---|---|---|
| 6,093,659 A | | 7/2000 | Grider et al. |
| 6,140,207 A | * | 10/2000 | Lee .......................... 438/427 |
| 6,180,491 B1 | * | 1/2001 | Joyner et al. ............... 438/424 |
| 6,245,641 B1 | * | 6/2001 | Shiozawa et al. ........... 438/427 |
| 6,277,709 B1 | | 8/2001 | Wang et al. |
| 6,306,723 B1 | | 10/2001 | Chen et al. |

OTHER PUBLICATIONS

K.V. Rao et al., "Trench Capacitor Design Issues In VLSI DRAM Cells", 1986 IEEE, Section 6, 4 pgs.

* cited by examiner

SEMICONDUCTOR DEVICE STRUCTURE AND METHOD FOR FORMING

This Application is a Continuation-in-Part of U.S. patent application Ser. No. 09/997,145, entitled "Semiconductor Device Structure and Method for Forming," filed on Nov. 29, 2001, and assigned to the current Assignee hereof.

RELATED APPLICATION

This is related to U.S. patent application Ser. No. 10/045,863, entitled "Semiconductor Device Structure and Method for Forming," filed on even date, and assigned to the current assignee hereof.

FIELD OF THE INVENTION

The present invention relates generally to a semiconductor device structure and more specifically to trench isolation structures.

RELATED ART

The ability to integrate a wider variety of devices and structures into a single integrated circuit allows for increased speed and efficiency while reducing costs. However, problems arise during the integration of these different devices and structures. For example, some integrated circuits require multiple types of shallow trench isolation having different properties. An embedded non-volatile memory (NVM), for example, requires good trench corner rounding for bitcell reliability, endurance, and uniform program/erase threshold voltage distribution. However, logic devices located within a same integrated circuit as the NVM require narrower trenches but with less severe corner rounding as compared to the trenches within the embedded NVM. Filling of these narrower trenches, though, may result in voids, thus limiting the yield of the integrated circuit. Therefore, a need exists for the formation of semiconductor device structures within an integrated circuit having different isolation properties and requirements.

BRIEF DESCRIPTION OF THE DRAWINGS

The present invention is illustrated by way of example and not limited by the accompanying figures, in which like references indicate similar elements, and in which.

DETAILED DESCRIPTION OF THE DRAWINGS

System on a chip solutions require the ability to fabricate different semiconductor device structures into a same chip. However, as mentioned above, different semiconductor device structures may have different isolation requirements. For example, system on a chip solutions may require both NVM device and logic to be within the same chip. Trenches within an NVM device, though, generally require wider trenches with a thicker oxide lining and greater trench corner rounding as compared to trenches outside the NVM device. Therefore, different regions within a chip may require different trench widths.

Figure 1:
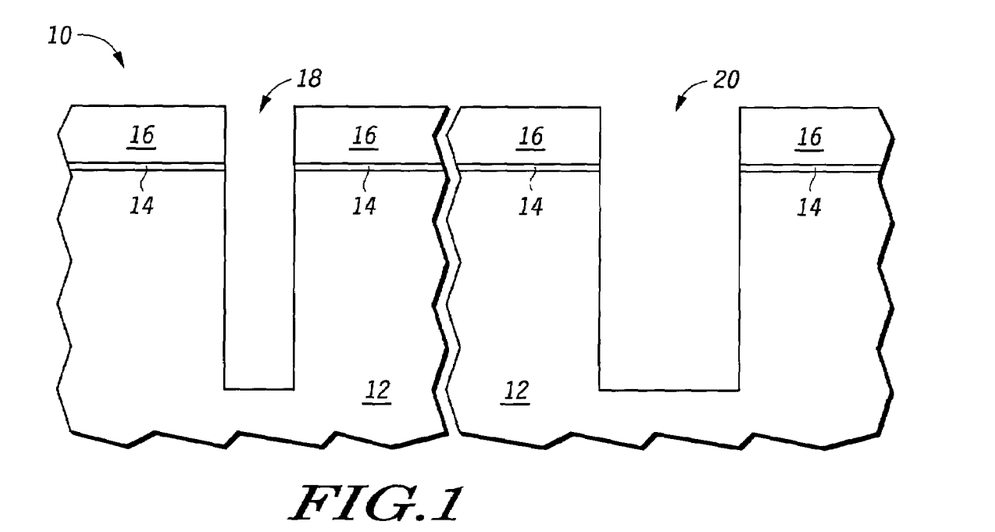
FIGS. 1–5 illustrate sequential cross sectional views of a semiconductor device structure made in accordance with one embodiment of the present invention.

FIG. 1 illustrates one embodiment of a semiconductor device structure 10 having a narrower width trench 18 and a wider width trench 20 within a substrate 12, a stress relief layer 14, and a barrier layer 16 where narrower width trench 18 is narrower than wider width trench 20. For example, narrower width trench 18 may have a width of approximately 1800 Angstroms and wider width trench 20 may have a width of approximately 3600 Angstroms. (Note that these widths are only examples, and each trench may have any width, as appropriate, so long as narrower width trench 18 is narrower than wider width trench 20.) Each trench may have a depth (as measured from the top surface of substrate 12) in a range of approximately 2500 Angstroms to 6000 Angstroms. Typically, wider width trench 20 and narrower width trench 18 have a same depth, but in alternate embodiments, the depths may be different.

Substrate 12 can be, for example, a silicon substrate, a gallium arsenide substrate, a silicon germanium substrate, a silicon-on-insulator (SOI) substrate, or any other appropriate substrate. Stress relief layer 14 may be an oxide layer, or may be any other appropriate material that provides stress relief for barrier layer 16, such as, for example, a nitride layer. Typically, stress relief layer 14 has a thickness in a range of approximately 100 to 200 Angstroms. In one embodiment, stress relief layer 14 has a thickness of approximately 150 Angstroms. In one embodiment, barrier layer 16 may be made of any type of material that does not oxidize. For example, barrier layer 16 may be a nitride layer. Typically, barrier layer 16 has a thickness in a range of approximately 1000 to 2000 Angstroms. In one embodiment, barrier layer 16 has a thickness of approximately 1400 Angstroms. (Therefore, stress relief layer 14 may also be referred to as a pad oxide and barrier layer 16 may also be referred to as a pad nitride.) Narrower trench 18 may be located in a logic section of an integrated circuit while wider trench 20 may be located in an embedded NVM within the integrated circuit. However, narrower width trench 18 and wider width trench 20 may be located in any region within the integrated circuit and are not limited to the logic areas or embedded NVM, respectively.

Figure 2:
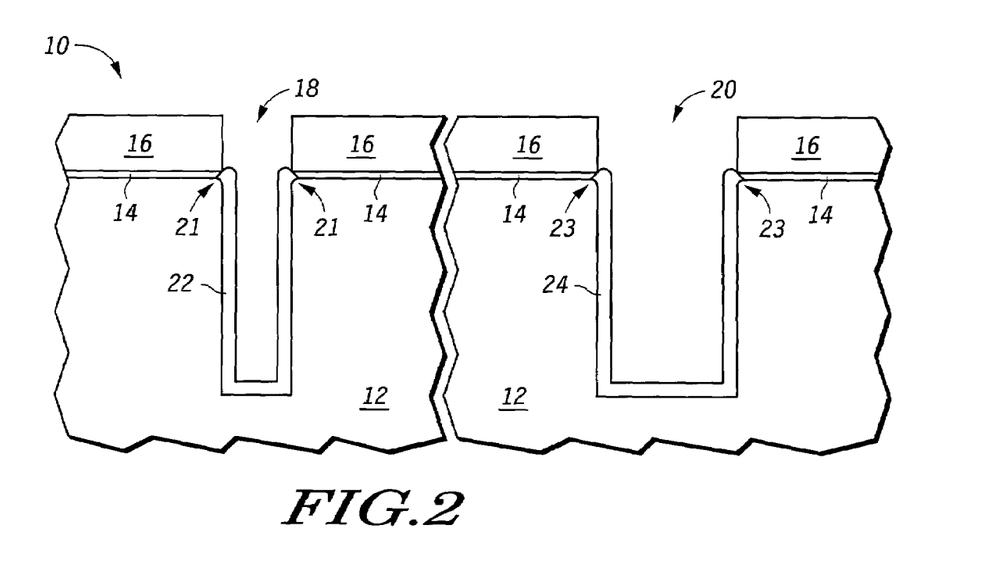

FIG. 2 illustrates one embodiment of semiconductor device structure 10 after formation of a liner within trenches 18 and 20. In one embodiment, oxide liner layers 22 and 24 are formed simultaneously by thermally growing oxide within the trenches. Wider width trench 20 may require a thicker oxide liner layer 24 with a greater degree of corner rounding 23 as compared to the oxide liner layer 22 and corner rounding 23 within narrower width trench 18. Therefore, in one embodiment, oxide liner layer 24 is grown to a thickness of approximately 250 Angstroms. However, oxide liner layer 22 also grows to a same thickness (approximately 250 Angstroms, in this embodiment). Since the oxide grows more on the sides than on the bottom of the trenches, the trench widths of both narrower width trench 18 and wider width trench 20 are each decreased by approximately 600 Angstroms (i.e. 300 Angstroms per side, corresponding to the 250 Angstroms that were grown in this embodiment). Therefore, the depth of wider width trench 20, as measured from the top of barrier layer 16, may be, in this embodiment, approximately 5800 Angstroms. After formation of oxide liner layer 24, the width of wider width trench 20 may be, in one embodiment, approximately 3000 Angstroms (assuming a width of 3600 Angstroms before the formation of oxide liner layer 24). Therefore, the resulting aspect ratio in this embodiment is approximately 1.9 to 1 (i.e. 5800/3000 to 1). Similarly, the depth of narrower width trench 18, as measured from the top of barrier layer 16, may be, in one embodiment, approximately 5800 Angstroms. After formation of oxide liner layer 22, the width of narrower width trench 18 may be, in this embodiment, approximately 1200 Angstroms (assuming a width of 1800 Angstroms before formation of oxide liner layer 22). Therefore, the resulting aspect ratio in this embodiment is approximately 4.8 to 1 (i.e. 5800/1200 to 1).

As can be seen in reference to FIG. 2, the resulting aspect ratio for narrower width trench 18 is greater than the resulting aspect ratio for wider width trench 20. Furthermore, the aspect ratio of narrower width trench 18 may be large enough to prevent complete filling of the trench, thus possibly causing the formation of voids. These voids within the trenches may lead to shorts (such as, for example, by polysilicon) within the surrounding circuitry and reduce yield of the resulting integrated circuit. However, sufficient oxide still needs to be grown to achieve the desired corner rounding 23 of substrate 12 within wider width trench 20. Growing the desired amount of oxide within wider width trench 20, though, may result in an aspect ratio of narrower width trench 18 that results in the creation of voids.

The rounded corners of substrate 12, illustrated in FIG. 2 as corners 21 and 23, allow for improved gate oxide reliability. Therefore, different regions of an integrated circuit may require different degrees of corner rounding (for example, in one embodiment, corners 21 may have different degrees of rounding as compared to corners 23). In one embodiment, the radius of curvature for corners 21 and 23 is at least approximately 200 Angstroms. Also, note that although the above embodiment has been described in reference to using a thermally grown oxide for liner layers 22 and 24, alternate embodiments may use any variety of materials for liners in place of oxide liner layer 22 and 24. (Therefore, oxide liner layers 22 and 24 may also be referred to as insulator liners.) For example, in one embodiment, an oxynitride layer may be used instead of oxide liner layers 22 and 24. Alternatively, any material capable of forming rounded corners 21 and 23 at the top of trenches 18 and 20 may be used in place of oxide liner layers 22 and 24.

Figure 3:
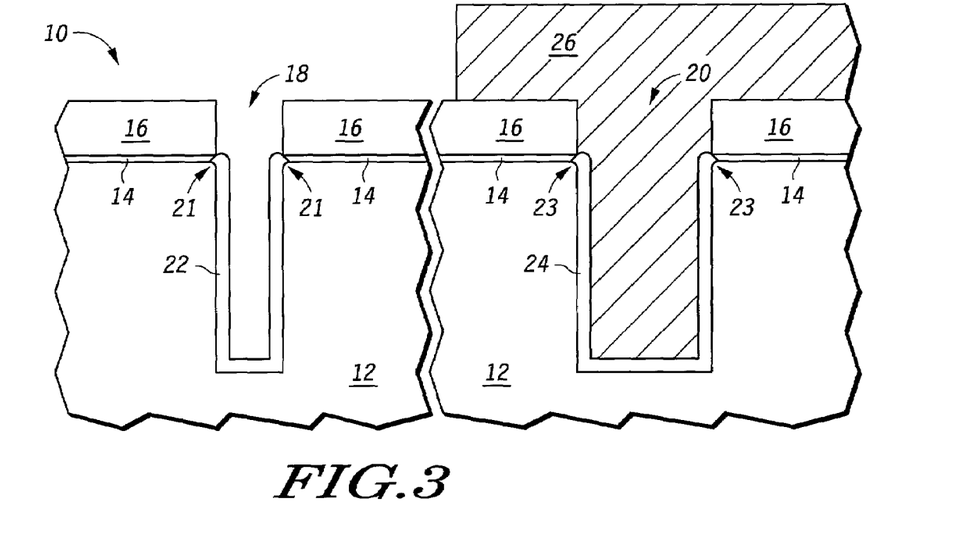
Figure 4:
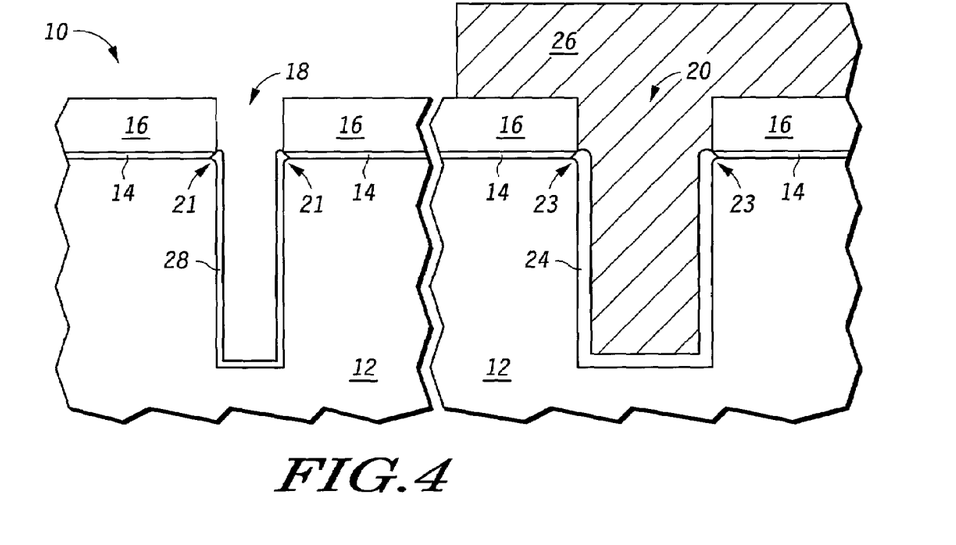

FIG. 3 illustrates one embodiment of semiconductor device structure 10 after formation of a masking layer 26 overlying wider width trench 20. Masking layer 26 covers wider width trench 20 while leaving narrower width trench 18 exposed. FIG. 4 illustrates one embodiment of semiconductor device structure 10 after an etch step is performed in order to remove at least a portion of oxide liner layer 22 to form optional oxide liner layer 28. That is, if the etch step removes all of liner layer 22 within narrower width trench 18, no liner layer would be present. However, in one embodiment, only portions of oxide liner layer 22 are removed to form a thinner liner layer, oxide liner layer 28 (where, in one embodiment, oxide liner layer 28 has a thickness of at least approximately 50 Angstroms). In one embodiment, approximately 100 Angstroms are removed such that oxide liner layer 28 is 100 Angstroms thinner as compared to oxide liner layer 22. Using the same width and depth values used in the embodiment described above, this reduces the aspect ratio of narrower width trench 18 to approximately 4.15 to 1 (i.e. 5800/1400 to 1) without affecting the aspect ratio of wider width trench 20. The reduction in aspect ratio of narrower width trench 18 from 4.8 to 1 down to 4.15 to 1 helps ensure that no voids are created within narrower width trench 18 during a subsequent trench fill step. Therefore, masking layer 26 can be used to mask any trench region where oxide is not to be removed from the oxide liner layers within the trenches.

In one embodiment, masking layer 26 has a thickness of at least approximately 5000 Angstroms. Alternatively, masking layer 26 can be of any thickness and material that prevents the reduction in the thickness of liner layer 24 within wider width trench 20. For example, a wet etch may be used to remove a portion of oxide liner layer 22 (or to completely remove oxide liner layer 22). In this example, masking layer 26 would be a photoresist layer and portions of oxide liner layer 22 would be removed with a wet etchant, such as hydrofluoric acid. (That is, semiconductor device structure 10 may be dipped into hydrofluoric acid to remove portions of oxide liner layer 22.) Alternatively, a dry etch may be used to remove portions of oxide liner layer 22. In this example, masking layer 26 would be a photoresist layer and portions of oxide liner layer 22 would be removed with a dry etchant, such as a fluorine-containing plasma. However, alternate embodiments may use different processes and masking layer materials to reduce (or remove) liner layers from selected trenches within semiconductor device structure 10.

Therefore, it can be appreciated how trenches having different isolation properties may be formed within a same integrated circuit or chip. Insulator liner layers can be formed under a process that produces a sufficient liner thickness and sufficient corner rounding for wider width trenches. However, since the same thickness liner will also be formed within narrower width trenches that may not require the same corner rounding or liner thickness, a masking process may be used to protect the wider width trenches while the liner layers within the narrower width trenches are reduced or removed (thus reducing their corresponding aspect ratios). Therefore, voids can be prevented within the narrower width trenches.

Figure 5:
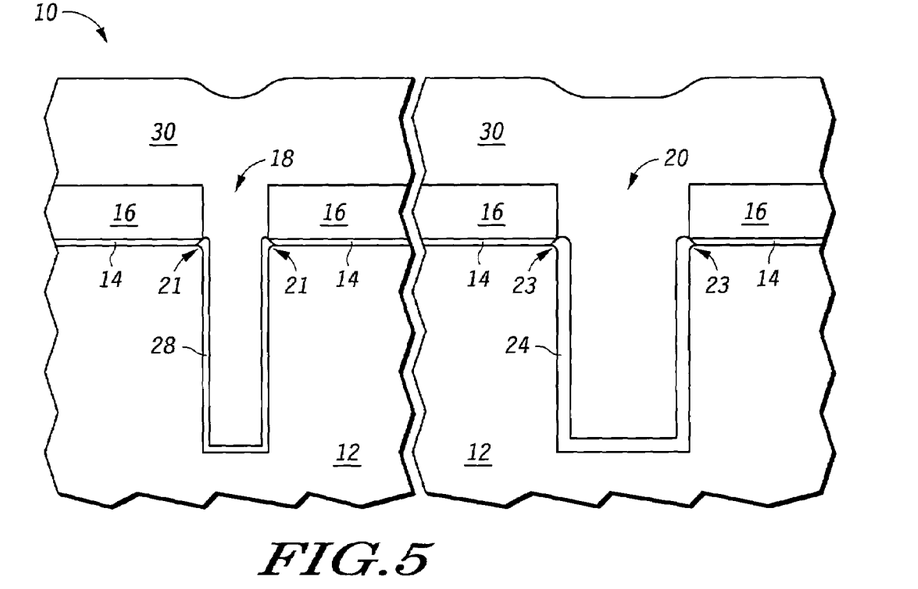

FIG. 5 illustrates one embodiment of semiconductor device structure 10 after removing masking layer 26 and subsequently forming a trench fill layer 30. Masking layer 26 may be removed using any known techniques. In one embodiment, trench fill layer 30 is a blanket insulator film deposited using high density plasma (HDP) over barrier layer 16, and within trenches 18 and 20. Trench fill layer 30 is typically an insulating layer, such as an oxide. In alternate embodiments, trench fill layer 30 may be any other suitable material or may be formed using any other suitable techniques (such as, for example, atmospheric pressure deposition, low pressure chemical vapor deposition (LPCVD), etc.). Due to the reduction in the aspect ratio of narrower width trench 18, voids are not formed within narrower width trench 18 when trench fill layer 30 is formed. Subsequently (not shown), trench fill layer 30 may be planarized to remove excess portions of trench fill layer 30 overlying barrier layer 16. Portions of barrier layer 16 may also be removed during this planarization step. Conventional processing may then follow to form a completed integrated circuit, such as, for example, a microprocessor, a microcontroller, analog circuitry, non volatile memory, radio frequency circuitry, etc. Therefore, in one embodiment, semiconductor device structure 10 may be a portion of an integrated circuit.

Figure 6:
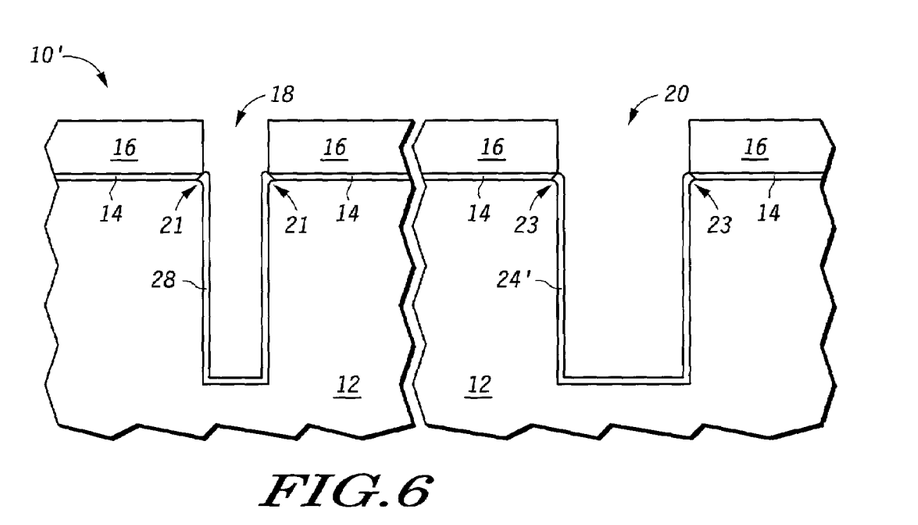
FIGS. 6–7 illustrate sequential cross sectional views of a semiconductor device structure made in accordance with an alternate embodiment of the present invention Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

An alternate embodiment of semiconductor device structure 10 is illustrated in FIG. 6 as semiconductor device structure 10'. The formation of semiconductor device structure 10' begins as described above in reference to FIGS. 1 and 2, and as illustrated in FIGS. 1 and 2. Therefore, after completing the structure illustrated in FIG. 2, process continues as illustrated in FIG. 6 to form semiconductor device structure 10'. After the formation of oxide liner layers 22 and 24, at least portions of oxide liner layers 22 and 24 are removed to form optional thinner oxide liner layers 28 and 24', as illustrated in FIG. 6. That is, if the removal step removes all of liner layers 22 and 24, no liner layer would be present in trenches 18 and 20. However, in one embodiment, only portions of oxide liner layers 22 and 24 are removed to form thinner oxide liner layers 28 and 24' (where, in one embodiment, oxide liner layers 28 and 24' each have a thickness of at least approximately 50 Angstroms). In one embodiment, approximately 100 Angstroms are removed such that oxide liner layers 28 and 24' are 100 Angstroms thinner as compared to oxide liner layers 22 and 24. In this embodiment, unlike the embodiment illustrated in FIGS. 3 and 4, the aspect ratios of both narrower width trench 18 and wider width trench 20 are affected. As above, the reduction in aspect ratio of narrower width trench 18 from 4.8 to 1 down to 4.15 to 1 helps ensure that no voids are created within narrower width trench 18 during a subsequent trench fill step. The reduction in aspect ratio of wider width trench 20, however, does not affect the resulting corner rounding (e.g. rounded corners 23), and still allows for a sufficiently thick oxide liner layer 24', if desired.

In one embodiment, the portions (or entirety) of oxide liner layers 22 and 24 may be removed using an etch step. For example, a wet etch may be used to remove portions of oxide liner layers 22 and 24 (or to completely remove oxide liner layers 22 and 24). In this example, portions of oxide liner layers 22 and 24 would be removed with a wet etchant, such as hydrofluoric acid. (That is, semiconductor device structure 10 may be dipped into hydrofluoric acid to remove portions of oxide liner layers 22 and 24 to form semiconductor device structure 10' having oxide liner layers 28 and 24' or having no oxide liner layers at all.) Alternatively, a dry etch may be used to remove portions of oxide liner layers 22 and 24. In this example, portions of oxide liner layers 22 and 24 would be removed with a dry etchant, such as a fluorine-containing plasma. However, alternate embodiments may use different processes to reduce (or remove) liner layers from selected trenches within semiconductor device structure 10 to form semiconductor device structure 10'.

Figure 7:
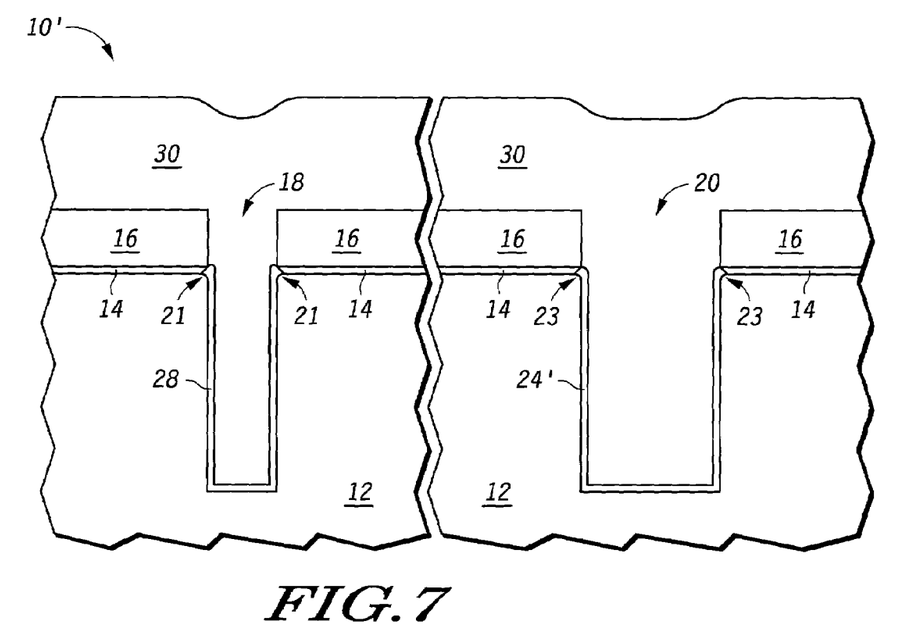

Therefore, it can be appreciated how the embodiment illustrated in FIG. 6 results in sufficient liner thicknesses and sufficient corner rounding for both narrower and wider width trenches without the use of a masking layer such as masking layer 26 in FIGS. 3 and 4. That is, insulator liner layers (such as, for example, oxide liner layers 28 and 24') can be formed under a process that produces sufficient liner thicknesses and sufficient corner rounding for a variety of different trenches having different widths. In this manner, the liner layers within narrower width trenches can be reduced or removed (thus reducing their corresponding aspect ratios) to prevent the formation of voids within these narrower width trenches. Furthermore, the voids can be prevented without the use of a masking layer (such as masking layer 26) if a thinner oxide liner layer such as oxide liner layer 28 is sufficient (or if no oxide liner layer in wider width trench 20 is desired). That is, the use of masking layer 26 allows for the formation of a thinner oxide liner layer 28 (or no liner layer within narrower width trench 18) without affecting oxide liner layer 24. However, without the use of masking layer 26, as illustrated in FIGS. 6 and 7, both oxide liner layers 22 and 24 are etched to form optional oxide liner layers 28 and 24' (or no liner layers within trenches 18 and 20). Note also that in this embodiment (without the use of masking layer 26), the resulting oxide liner layers 28 and 24' have generally the same thickness.

FIG. 7 illustrates one embodiment of semiconductor device structure 10' after subsequently forming a trench fill layer 30. The method of forming trench fill layer 30 and the materials used for trench fill layer 30 are as described above in reference to FIG. 5. As with FIG. 5, here in FIG. 7, due to the reduction in the aspect ratio of narrower width trench 18, voids are not formed within narrower width trench 18 when trench fill layer 30 is formed. Processing after the formation of trench fill layer 30 also remains the same as was described above to form a completed integrated circuit, such as, for example, a microprocessor, a microcontroller, analog circuitry, non volatile memory, radio frequency circuitry, etc. Therefore, in one embodiment, semiconductor device structure 10' may be a portion of an integrated circuit.

In the foregoing specification, the invention has been described with reference to specific embodiments. However, one of ordinary skill in the art appreciates that various modifications and changes can be made without departing from the scope of the present invention as set forth in the claims below. For example, the aspect ratios given above for narrower width trench 18 and wider width trench 20 are only examples. Alternate embodiments may use any variety of dimensions, as appropriate, to form trenches 18 and 20, and liner layers 22, 24, and 28. Therefore, any of the dimensions provided herein are only examples of possible values. Furthermore, any of the materials discussed herein are also provided as examples. For example, as discussed above, alternate embodiments may use other materials for forming liner layers 22, 24, and 28, and are not limited to oxide layers. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method for forming a semiconductor device structure in a semiconductor layer, comprising:
   forming a first trench of a first width and a second trench of a second width in the semiconductor layer;
   growing a first insulator liner in the first trench and a second insulator liner in the second trench;
   forming a mask over the second trench;
   etching at least a portion of the first insulator liner while the mask is over the second trench;
   removing the mask; and
   depositing an insulating layer in the first trench and the second trench.

2. The method of claim 1, wherein the first width is less than the second width.

3. The method of claim 1, wherein the step of etching comprises completely removing the first insulator liner.

4. The method of claim 1, wherein the step of etching results in leaving at least one hundred Angstroms of the first insulator liner.

5. The method of claim 1, wherein the step of growing the first insulator liner and the second insulator liner comprises growing oxide in the first trench and the second trench.

6. The method of claim 1, wherein the step of etching comprises dipping the semiconductor device structure in hydrofluoric acid.

7. The method of claim 1, wherein the step of etching comprises applying a dry etch chemistry to the semiconductor device structure.

8. The method of claim 1, wherein the insulator layer comprises high density plasma oxide fill.

9. The method of claim 1, further comprising forming a barrier layer and a stress relief layer over the semiconductor layer in areas adjacent to the first trench and the second trench.

10. The method of claim 1, further comprising forming a pad nitride and pad oxide over the semiconductor layer prior to forming the first trench and the second trench, and wherein the step of forming the first trench and the second trench comprises etching through selected portions of the pad nitride and the pad oxide and into the semiconductor layer.

11. A method for forming a semiconductor device structure in a semiconductor layer, comprising:
forming a first trench of a first width and a second trench of a second width in the semiconductor layer, the first width being less than the second width;
growing a first insulator liner in the first trench and a second insulator liner in the second trench;
forming a mask over the second trench; and
etching at least a portion of the first insulator liner while the mask is over the second trench.

12. The method of claim 11, wherein the step of etching comprises a wet etch.

13. The method of claim 12, wherein the step of etching comprises dipping the semiconductor device structure in hydrofluoric acid.

14. The method of claim 11, wherein the etching comprises a dry etch.

15. The method of claim 11, wherein the step of growing the first insulator liner and the second insulator liner comprises growing oxide in the first trench and the second trench.

16. The method of claim 11, wherein:
the semiconductor layer has a top surface;
the second trench has a corner where the trench adjoins the top surface of the semiconductor layer; and
the step of growing the first insulator liner and the second insulator liner comprises rounding of the corner of the second trench.

17. The method of claim 16, wherein the corner is semiconductor.

18. The method of claim 11, wherein the step of etching comprises leaving at least 100 Angstroms of the first insulating liner.

19. The method of claim 11, wherein the step of etching comprises removing the first insulating liner.

20. The method of claim 11, further comprising forming a barrier layer and a stress relief layer over the semiconductor layer in areas adjacent to the first trench and the second trench.

21. The method of claim 20, wherein the barrier layer comprises nitride and the stress relief layer comprises oxide.

22. A method for forming a semiconductor device structure in a semiconductor layer, comprising:
forming a first trench of a first width in the semiconductor layer;
forming a second trench of a second width greater than the first width in the second semiconductor layer;
growing a first insulator liner in the first trench and a second insulator liner in the second trench;
etching a portion of the first insulator liner; and
depositing an insulating layer in the first trench.

23. The method of claim 22 further comprising
forming a mask over the second trench prior to the step of etching; and
removing the mask prior to the step of depositing.

24. The method of claim 22, wherein the step of etching further comprises etching a portion of the second insulator liner and leaves at least 50 Angstroms of the first insulator liner and 50 Angstroms of the second liner.

25. A method for forming a semiconductor device structure in a semiconductor layer, comprising:
forming a first trench of a first width in the semiconductor layer;
forming a second trench of a second width in the second semiconductor layer;
growing a first insulator liner in the first trench and a second insulator liner in the second trench;
etching a portion of the first insulator liner and a portion of the second insulator liner; and
depositing an insulating layer in the first trench and the second trench.

26. The method of claim 25, wherein the step of etching comprises a wet etch.

27. The method of claim 26, wherein the wet etch uses hydrofluoric acid.

28. The method of claim 25, wherein the first insulator and the second insulator liner comprises thermal oxide.

29. The method of claim 25, wherein the step of depositing comprises filling the first trench and second trench.

30. The method of claim 29, wherein the insulating layer comprises high density plasma oxide.

31. A method for forming a semiconductor device structure in a semiconductor layer having a top surface, comprising:
forming a first trench of a first width in the semiconductor layer and having a first corner at the surface of the semiconductor layer;
forming a second trench of a second width greater than the first trench in the second semiconductor layer and having a second corner at the surface of the semiconductor layer;
growing a first insulator liner in the first trench and a second insulator liner in the second trench to achieve a radius of curvature of at least 200 Angstroms in the first and second corner;
etching a portion of the first insulator liner and a portion of the second insulator liner; and
depositing an insulating layer in the first trench and the second trench that fills the first and second trenches, wherein the insulating layer is free of voids.

32. The method of claim 31, wherein the first insulator liner and the second insulator liner are thermal oxide.

33. The method of claim 31, wherein the step of etching leaves the first insulator liner and the second insulator liner at a thickness sufficiently small to allow for completely filling the first trench with the insulating layer without voids in the insulating layer.

34. The method of claim 33, wherein the insulating layer comprises high density plasma oxide.

35. The method of claim 31, wherein the step of etching is further characterized as leaving at least 50 Angstroms of the first insulator liner and the second insulator liner.

* * * * *